Dec. 15, 1964 B. R. KUHL ET AL 3,161,815

AUTOMATIC TELEVISION CHANNEL SELECTOR

Filed July 12, 1960 2 Sheets-Sheet 1

Inventors:
Bernard R. Kuhl
Joseph A. Carlson
By Hofgren, Brady, Wegner, Allen & Stellman
Attorneys.

AUTOMATIC TELEVISION CHANNEL SELECTOR

Filed July 12, 1960 2 Sheets-Sheet 2

Inventors:
Bernard R. Kuhl
Joseph A. Carlson
By Hofgren, Brady, Wegner, Allen & Stellman
Attorneys.

3,161,815

AUTOMATIC TELEVISION CHANNEL SELECTOR

Bernard R. Kuhl, Arlington Heights, and Joseph A. Carlson, Glen Ellyn, Ill., assignors to Warwick Electronics Inc., a corporation of Delaware Filed July 12, 1960, Ser. No. 42,377
7 Claims. (Cl. 318—467)

This invention relates to a television tuner control and more particularly to improvements in an automatic television channel selector.

Tuner controls of the type disclosed in this application afford automatic channel selection by the mere touching of a momentary contact switch, energizing a motor which drives a channel selector switch operating in association with the receiver tuning circuits. Various means are utilized to control the motor and thereby select a particular channel for the viewer.

Close tolerances for all component parts in an automatic tuner had heretofore been required and their relative positions to each other in assembly quite critical. Both of these requirements result in increased manufacturing costs and increase and possibility of faulty channel selections.

One object of this invention is to provide a simple, economical, automatic control for a television tuner that does not require costly close tolerance component parts and will quickly and accurately select the desired television channel.

A further object of this invention is the provision of a control knob with a peripheral surface, whereby one leaf of an adjustable control switch rides on the surface and insures correct relationship between the two contacts of the switch without close control over the tolerance of the control knob surface.

A further object of the invention is the provision of a novel cam clip that may be easily moved in and out of operational relationship with the other elements of the tuner.

A still further object of this invention is the provision of an adjustable mounting for a control switch so that the relative position of the switch with respect to the other component parts of the television tuner can be accurately set and maintained to insure proper channel selection.

Further objects and advantages will become apparent from the following detailed description taken in connection with the accompanying drawings, in which.

Figure 1:
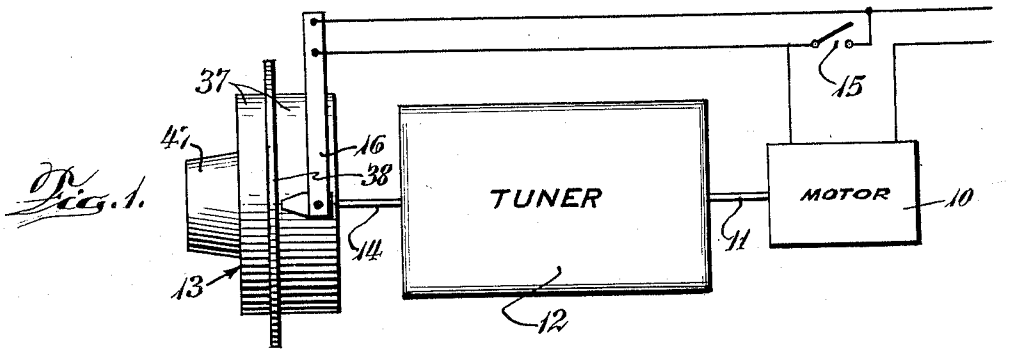
FIGURE 1 is a diagrammatic view of the tuner section of a receiver, embodying the invention.

While this invention is susceptible of embodiments in many different forms, there is shown in the drawings and will herein be described in detail a preferred embodiment of the invention with the understanding that the present disclosure is to be considered as an exemplification of the principles of the invention and is not intended to limit the invention to the embodiment illustrated. The scope of the invention will be pointed out in the appended claims.

Referring to FIGURE 1 which illustrates the component parts of the automatic television tuner, a motor 10 is drivingly connected with shaft 11 at one end of a channel selector switch, not shown, the switch being associated with and housed within a tuner 12. A control knob 13 is attached to a shaft 14 which is affixed to the other end of the channel selector switch and may be an extension of shaft 11. A momentary starting switch 15 supplies power to motor 10 from a suitable source (not shown) thereby rotating the channel selector switch within tuner 12 and changing the circuitry to provide different channels for the viewer. A spring leaf control switch 16 is associated with control knob 13 and operates to stop the motor 10 at a desired channel station.

Figures 2, 4:
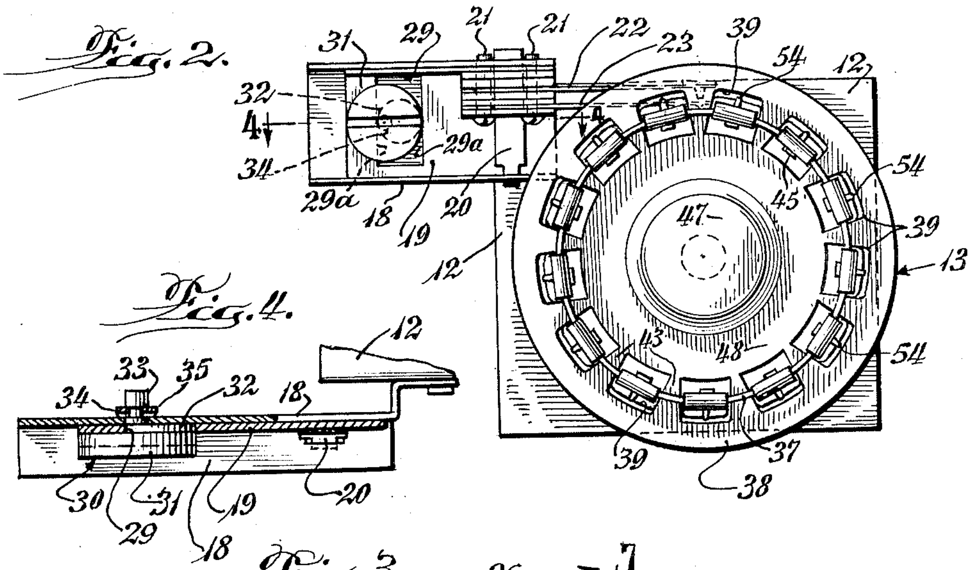
FIGURE 2 is a front elevational view of the tuner.
FIGURE 4 is an enlarged fragmentary section of the control switch mounting taken substantially along line 4—4 of FIGURE 2.
Figure 3:
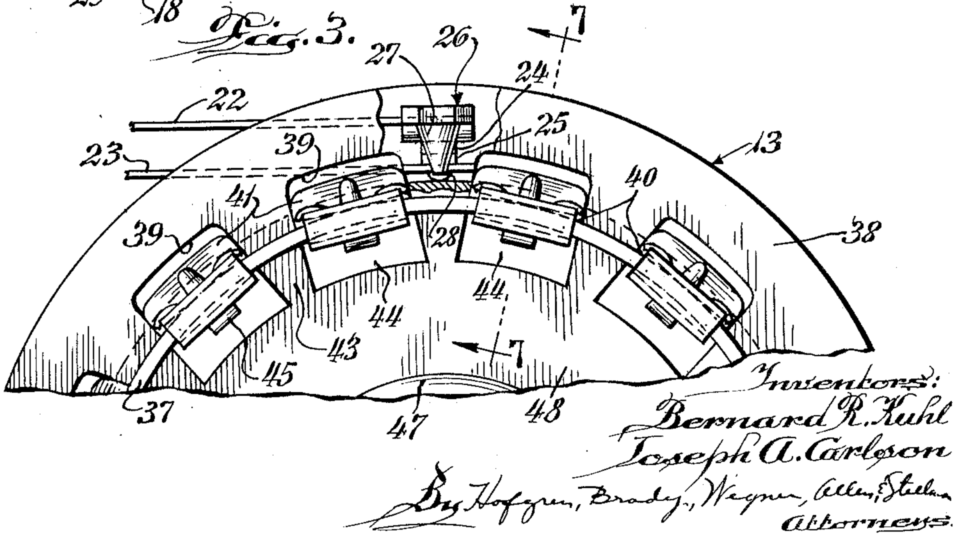
FIGURE 3 is an enlarged fragmentary front elevational view, partly in section, of the control knob and control switch.

FIGURES 2 and 4 show a channel shaped bracket 18 rigidly affixed to the front of tuner 12, an angle clip 19 is slidably mounted in channel bracket 18 and retained in place by a spring clip 20. A control switch 16 is mounted to the horizontal leg of angle clip 19 by screws 21 and is of the spring leaf type having elongated leaf springs 22 and 23, separated by insulating material at the mounted end and having contacts 24 and 25 at the other end. A cam follower 26 of an insulating material such as a suitable plastic, is secured to and extends at right angles from the end of the upper leaf spring 22 adjacent contact 24. An inverted conical tip 27 is located on the underside of cam follower 26 adjacent the end, forming a part thereof. Contact 25 is the top portion of a rivet connection securing itself to leaf spring 23, the bottom portion of said rivet connection forming a button 28 on the underside of leaf spring 23.

Angle clip 19 is slidably mounted in channel bracket 18 and has a rectangular hole 29 located in the vertical leg adjacent one end, and having sides 29*a*. Angle clip 19 and channel bracket 18 are held together by an adusting screw 30 having a slotted circular head 31 and an eccentric circular cam 32 disposed on the underside of the head 31, the diameter of the cam being equal to the distance between sides 29*a* and the thickness equal to the thickness of the vertical leg of angle clip 19. The rectangular hole 29 receives eccentric cam 32; and a stub shaft 33 centrally located with head 31 and extending outwardly from cam 32 is fitted through a hole in bracket 18. An annular groove 34 is provided around shaft 33 for receiving a locking clip 35 at the rear of bracket 18 thereby holding adjusting screw 30 in place relative to bracket 18. Referring to FIGURE 2, when the slotted head 31 is turned in either direction, by means of a suitable tool, the eccentric cam 32 is forced against side 29*a* of angle clip 19 and since clip 19 is slidably mounted in the channel bracket 18 it will be moved in a horizontal direction by the force applied through cam 32, adjusting control switch 16 in a horizontal direction at right angles to the axis of control knob 13 and generally tangential with the knob.

Control knob 13 is preferably molded from suitable insulating material, and comprises a main cylindrical member 37 with an outwardly extending flange 38 having a plurality of holes 39 equally spaced and adjacent the periphery of cylinder member 37. A plurality of equally spaced slots 40 are located in and around the outer surfaces of cylinder member 37 beginning at a point adjacent hole 39, and extending backward therefrom, terminating in a raised portion 41. A portion of the outer periphery of the cylinder member 37 from raised position 41 to the back edge has a smooth surface 42 against which button 28 on switch 16 is urged by the lower leaf spring 23. A plurality of equally spaced lugs 43 projecting inwardly from the inner surface of cylindrical member 37 and extend from the rear edge to a point opposite the flange 38 forming slots 44 on the inner surface of cylindrical member 37 which are opposite slots 40 on the outer surface. Disposed between each pair of lugs 43 is a sloping member 45 having its rear end terminating in a hooked figuration 46. A boss 47 is centrally disposed within cylindrical member 37 having a circular flange 48 which is attached at its outer periphery to the lugs 43 and is directly opposite the outwardly extending flange 38. The boss provides for a manual rotation of the control knob and affords a surface for numbering the channels.

Figures 5, 6, 7, 8, 9:
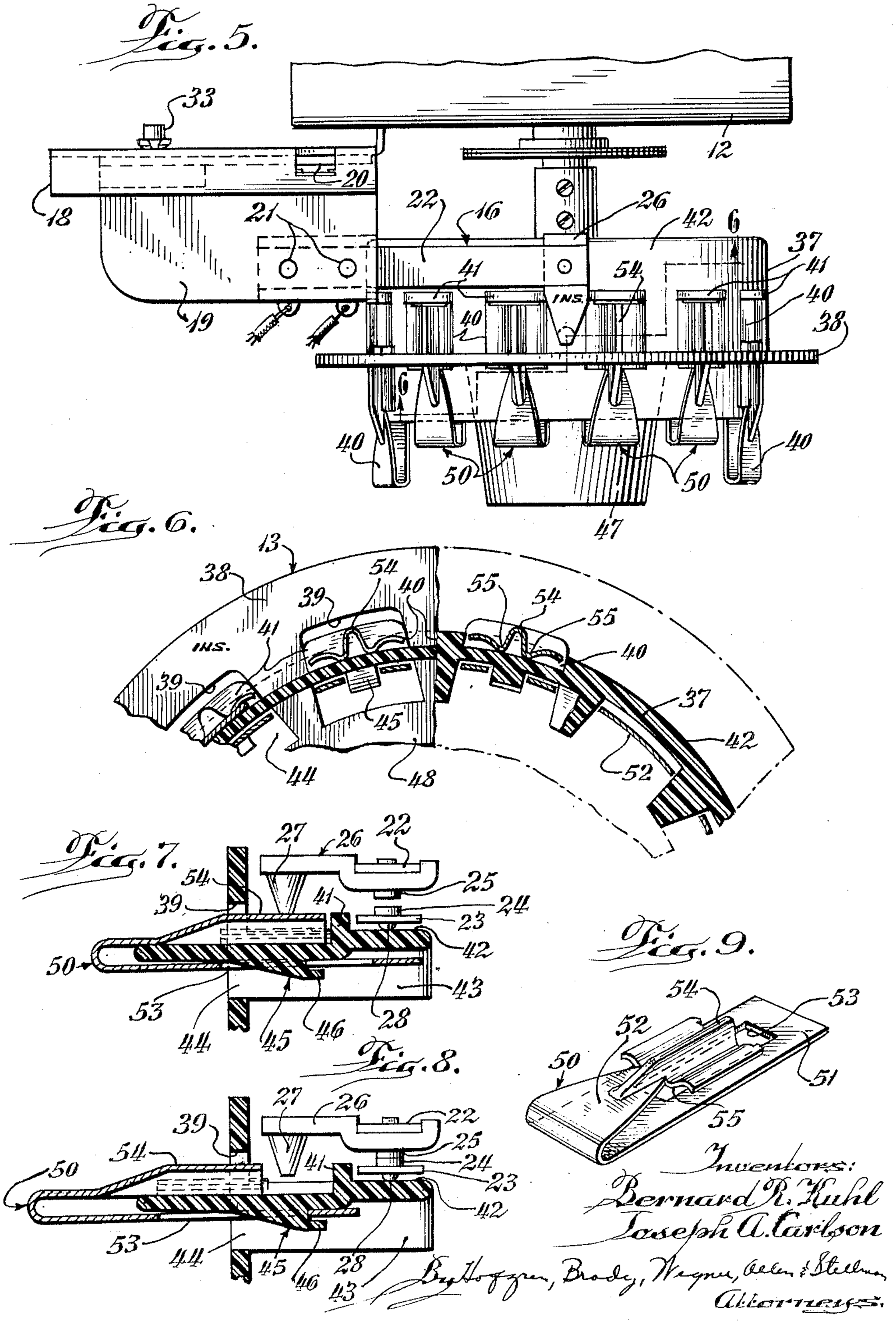
FIGURE 5 is a plan view of the tuner showing the cam slips in different positions.
FIGURE 6 is an enlarged sectional view, of the tuner control knob taken substantially along line 6—6 of FIGURE 5.
FIGURE 7 is an enlarged sectional view of the cam clip taken substantially along line 7——7 of FIGURE 3 and showing the control switch of the tuner in an open position.
FIGURE 8 is similar to FIGURE 7 but showing the control switch in a close position.
FIGURE 9 is a perspective view of the cam clip.

Referring to FIGURE 9, cam clip 50 is of a generally flat U-shaped configuration, a bottom leg 51 being longer than an upper leg 52 and being preferably made of a suitable spring steel. The bottom leg 51 has a rectangular cutout 53 and the top leg 52 is formed to produce an elongated raised cam surface 54; adjacent each side of the cam surface 54 is a formed depressed elongated surface 55.

The cam clip 50 is slidably mounted on the control knob 13 with the bottom leg 51 sliding in slot 44 and the top leg 52 in slot 40. Cutout 53 in the bottom leg 51 fits over sloping member 45 and the depressed surfaces 55 formed in the upper leg act as runners facilitating sliding of the cam clip on the slot 40. The cam clip 50 may be slid forward as shown in FIGURE 7 until it butts against the raised portion 41; or it may be pulled backward as shown in FIGURE 8 until restrained by the cutout 53 engaging the hook configuration 46 of sloping member 45.

The cam clip 50 may also be removed entirely by springing it over the sloping member 45 when it is in the forward position. The position of the cam clips 50 located about the periphery of the control knob corresponds to the position of the channel selector switch for the various television channels. As mentioned, button 28 on lower leaf spring 23 of control switch 16 is spring urged against surface 42 of the control knob and maintains surface contact as the control knob rotates. Cam follower tip 27 is positioned on top of raised cam surface 54 when the tuner is adjusted to a television channel and contacts 24 and 25 are open as shown in FIGURE 7.

The operation of the automatic TV tuner will now be described.

Momentary starting switch 15 is pressed and power is supplied to motor 10 which rotates the channel selector switch within tuner 12. Control knob 13 also rotates since it is connected to the channel selector switch.

The control switch 16 will immediately make contact since raised cam surface 54 will be rotated from under cam follower tip 27 and the upper leaf spring 22 will urge the contacts 24 and 25 to closed position. Power to motor 10 is now supplied through control switch 16 and the momentary starting switch 15 may be released. The control knob 13 continues to turn until another raised cam surface 54 comes under follower tip 27, thereby raising leaf spring 22 and opening contacts 24 and 25 of control switch 16, cutting off power to the motor and stopping rotation of the control knob at a position where the follower tip 27 is resting on raised cam surface 54 which corresponds to a station position of the channel selector switch. The control switch 16 is adjustable by adjusting screw 30 and will bring the cam follower tip 27 directly over the center of raised cam surface 54 and provide accurate channel selection.

If there is no television transmission on some of the channels, in the area of use, the cam clip 50 associated with such channel may be pulled out until it engages finger 46 as shown in FIGURE 8, this will take the cam clip out of operational position with follower tip 27 so that contacts 24 and 25 will not be affected and will remain in their normally closed position; the control knob 13 will rotate past this clip position until another cam clip engages the follower tip 27 and raises the control switch arm.

In other automatic tuners of this type there has heretofore been no support for bottom leaf spring 23 of control switch 18 and poor control of the making and breaking of the switch contacts has resulted. By supporting the lower spring leaf on surface 42 of the control knob 13 any irregularities in control knob tolerances will not result in inaccurate control switch operation since the contacts will not separate until the top spring leaf encounters a cam clip.

We claim:

1. An automatic television channel selector comprising: a tuning circuit with a channel selector switch associated therewith; a control knob attached to said switch; means for rotating said selector switch to different channel positions including a motor drivingly connected to said switch, a means for controlling the operation of said motor including a momentary starting contact and a spring leaf switch, said spring leaf switch mounted independently of said channel selector switch and having one leaf in contact with the surface of said control knob and riding thereon; and means for automatically operating said spring contact switch including at least one cam clip mounted on the periphery of said control knob and engaging the upper leaf of said spring contact switch as the control knob is rotated.

2. An automatic television channel selector, comprising: a tuning circuit with a channel selector switch associated therewith; a control knob attached to said switch; one or more cam clips mounted on said control knob; means for rotating said selector switch to different channel positions including a motor drivingly connected to said switch, a momentary starting contact, manually operated for starting said motor; a spring contact switch adjustably mounted independent of said channel selector switch and having its lower leaf riding on the outer peripheral surface of the control knob adjacent its outer edge, and having its upper leaf engaging and operable by said cam clips mounted around the periphery of said control knob adjacent said outer peripheral surface, said cam clips being slidably mounted on said control knob to bring them in or out of engagement with the spring leaf switch as the channel selector switch and control knob are rotated.

3. In an automatic television channel selector: a motor driven channel selector switch; a control knob attached to said switch and rotatable therewith; one or more cam clips individually mounted around the periphery of said control knob corresponding to channel positions of the channel selector switch, said cam clips engaging and operating a spring leaf switch as the clips are rotated with the control knob, wherein said cam clips are of a general flat U-shaped configuration, one leg of the U having a top surface containing a raised cam portion for engaging said spring leaf switch and the other leg having a slot formed therein for sliding engagement with a projection on said control knob.

4. In an automatic television channel selector comprising: a motor driven channel selector switch; a control knob attached to said switch and rotatable therewith; at least one cam clip mounted thereon and corresponding to channel positions of said channel selector switch; a spring leaf switch mounted independently of said channel selector switch and having two leaf contacts, the lower leaf riding on the outer peripheral surface of the control knob, adjacent its outer edge and the upper leaf engageable with said cam clips as the clips are rotated past the spring leaf switch.

5. The automatic television channel selector of claim 4 wherein the lower leaf of said spring switch has a bearing surface spring urged against said peripheral surface of the control knob, to follow the contours of said surface.

6. The automatic television channel selector of claim 4 wherein the contacts of the spring leaf switch are normally closed and the top leaf has a portion engaged by a cam clip to separate the contacts.

7. In an automatic television channel selector: a motor driven channel selector switch; a control knob attached to said switch and rotatable therewith and having one or more cam clips mounted thereon, and corresponding to channel positions of said channel selector switch; a spring leaf switch in a normally closed position and operable by said cam clips; an adjustable switch mounting means comprising an eccentric screw, manually rotatable and imparting a linear movement to the spring leaf switch, generally tangential to said control knob, said leaf switch being adjustable in position to provide accurate location of the leaf switch relative to the cam clips.

References Cited in the file of this patent

UNITED STATES PATENTS

| | | |
|---|---|---|
| 2,812,486 | Foster | Nov. 5, 1957 |
| 2,956,161 | Cady | Oct. 11, 1960 |
| 3,054,957 | Shook | Sept. 18, 1962 |